(12) United States Patent
Zhang et al.

(10) Patent No.: US 10,205,098 B2
(45) Date of Patent: Feb. 12, 2019

(54) SEMICONDUCTOR STRUCTURE AND SEMICONDUCTOR DEVICE USING THE SAME

(71) Applicants: Tsinghua University, Beijing (CN); HON HAI PRECISION INDUSTRY CO., LTD., New Taipei (TW)

(72) Inventors: Jin Zhang, Beijing (CN); Yang Wei, Beijing (CN); Kai-Li Jiang, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 15/916,390

(22) Filed: Mar. 9, 2018

(65) Prior Publication Data

US 2018/0342679 A1    Nov. 29, 2018

(30) Foreign Application Priority Data

May 24, 2017 (CN) .......................... 2017 1 0375318

(51) Int. Cl.
| | |
|---|---|
| *H01L 29/06* | (2006.01) |
| *H01L 31/00* | (2006.01) |
| *H01L 51/00* | (2006.01) |
| *B82Y 30/00* | (2011.01) |
| *H01L 21/02* | (2006.01) |

(Continued)

(52) U.S. Cl.
CPC .......... *H01L 51/0048* (2013.01); *B82Y 30/00* (2013.01); *H01L 21/02425* (2013.01); *H01L 21/02631* (2013.01); *H01L 29/0673* (2013.01); *H01L 29/41725* (2013.01); *H01L 51/444* (2013.01)

(58) Field of Classification Search
CPC ....... H01L 2224/73265; H01L 51/0048; H01L 51/0508; H01L 51/0583; H01L 51/0587; H01L 51/4266; H01L 51/444; H01L 51/0012; H01L 51/0026; H01L 51/0562; H01L 51/4213; H01L 21/02425; H01L 21/02631; H01L 29/0673; H01L 29/41725; H01L 35/24; B82Y 20/00; B82Y 10/00; B82Y 30/00; C30B 29/46; C30B 29/60; C30B 33/00; Y10S 977/75; Y10S 977/842; Y10S 977/954; Y10S 977/827; Y20S 977/938
USPC .................................... 257/24; 977/948, 950
See application file for complete search history.

(56) References Cited

U.S. PATENT DOCUMENTS

| | | | | |
|---|---|---|---|---|
| 9,773,990 | B1 * | 9/2017 | Zhang | .................. H01L 29/413 |
| 2008/0289685 | A1 * | 11/2008 | Chen | ...................... B82Y 30/00 |
| | | | | 136/256 |

(Continued)

*Primary Examiner* — Tram H Nguyen
(74) *Attorney, Agent, or Firm* — ScienBiziP, P.C.

(57) ABSTRACT

A semiconductor structure includes a semiconductor layer, a carbon nanotube and a conductive film. The semiconductor layer includes a first surface and a second surface. A thickness of the semiconductor layer ranges from 1 nanometer to 100 nanometers. The carbon nanotube is located on the first surface of the semiconductor. The conductive film is located on the second surface of the semiconductor. The conductive film is formed on the second surface by a depositing method. The carbon nanotube, the semiconductor layer and the conductive film are stacked with each other to form a three-layered stereoscopic structure.

13 Claims, 5 Drawing Sheets

(51) Int. Cl.
*H01L 29/417* (2006.01)
*H01L 51/44* (2006.01)

(56) References Cited

U.S. PATENT DOCUMENTS

2015/0034907 A1* 2/2015 Hersam ............... H01L 29/8611
                                                   257/26
2018/0006255 A1* 1/2018 Zhang .................... C22C 26/00

* cited by examiner

SEMICONDUCTOR STRUCTURE AND SEMICONDUCTOR DEVICE USING THE SAME

CROSS-REFERENCE TO RELATED APPLICATIONS

This application claims all benefits accruing under 35 U.S.C. § 119 from China Patent Application No. 201710375318.1, filed on May 24, 2017, in the China Intellectual Property Office, the contents of which are hereby incorporated by reference.

FIELD

The present disclosure relates to a semiconductor structure and a semiconductor device using the same.

BACKGROUND

A heterojunction is an interface region formed by a contact of two different semiconductor materials. According to the conductivity types of different semiconductor materials, the heterojunction can be divided into homogeneous heterojunction (P-p junction or N-n junction) and heterotypic heterojunction (P-n or p-N). A heterostructure can be formed by multilayer heterojunctions. The heterostructure can be used in semiconductor structure and semiconductor device.

BRIEF DESCRIPTION OF THE DRAWINGS

Implementations of the present technology will now be described, by way of example only, with reference to the attached figures, wherein.

DETAILED DESCRIPTION

Figure 1:
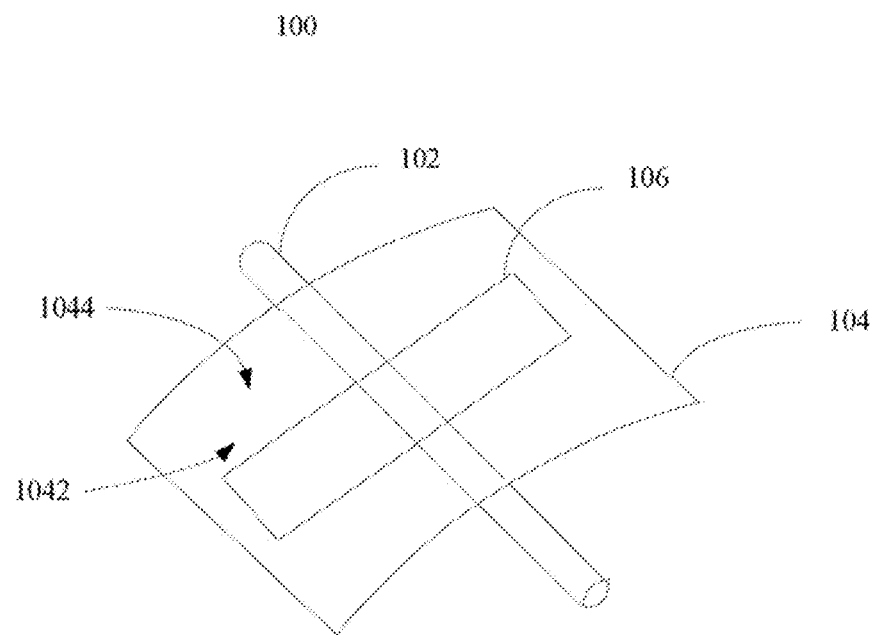
FIG. 1 is a structure schematic view of one embodiment of a semiconductor structure.

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean "at least one."

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts have been exaggerated to illustrate details and features of the present disclosure better.

Several definitions that apply throughout this disclosure will now be presented.

The term "substantially" is defined to be essentially conforming to the particular dimension, shape, or other feature which is described, such that the component need not be exactly or strictly conforming to such a feature. The term "comprise," when utilized, means "include, but not necessarily limited to"; it specifically indicates open-ended inclusion or membership in the so-described combination, group, series, and the like.

Figure 2:
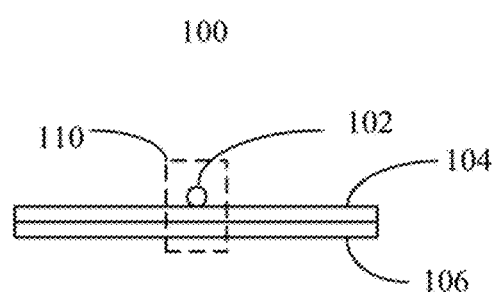
FIG. 2 is a side structure schematic view of the semiconductor structure in FIG. 1.

Referring to FIGS. 1-2, one embodiment is described in relation to a three layered semiconductor structure 100. The semiconductor structure 100 comprises a carbon nanotube 102, a semiconductor layer 104 and a conductive film 106. The semiconductor layer 104 is located between the carbon nanotube 102 and the conductive film 106. A thickness of the semiconductor layer 104 ranges from 1 nanometer to about 100 nanometers. The semiconductor layer 104 has a film structure defining a first surface 1042 and a second surface 1044. The first surface 1042 and the second surface 1044 are opposite surfaces of the semiconductor layer 104. The carbon nanotube 102 is oriented along a first direction and contacts one of the two opposite surfaces of the semiconductor layer 104. In particular, the carbon nanotube 102 directly contacts with the first surface 1042 of the semiconductor layer 104. The conductive film 106 contacts the second surface 1044 of the semiconductor layer. Thus, the semiconductor layer 104 is sandwiched between the carbon nanotube 102 and the conductive film 106. In one embodiment, the semiconductor structure 100 consists of the carbon nanotube 102, the semiconductor layer 104 and the conductive film 106.

The carbon nanotube 102 is a metallic carbon nanotube. The carbon nanotube 102 can be a single-walled carbon nanotube, a double-walled carbon nanotube, or a multi-walled carbon nanotube. A diameter of the carbon nanotube 102 can range from about 0.5 nanometers to about 150 nanometers. In one embodiment, the diameter of the carbon nanotube 102 ranges from about 1 nanometer to about 10 nanometers. In another embodiment, the carbon nanotube 102 is a single-walled carbon nanotube, and the diameter of the carbon nanotube 102 is in a range from about 1 nanometer to about 5 nanometers. In one embodiment, the carbon nanotube 102 is a metallic single-walled carbon nanotube, and the diameter of the carbon nanotube 102 is about 1 nanometer.

A thickness of the semiconductor layer 104 can range from about 1 nanometer to about 200 nanometers. In one embodiment, the thickness of the semiconductor layer 104 ranges from about 1 nanometer to about 100 nanometers, such as 10 nanometers or 20 nanometers. In another embodiment, the thickness of the semiconductor layer 104 ranges from about 1 nanometer to about 10 nanometers. The semiconductor layer 104 can be made from inorganic compound semiconductors, elemental semiconductors or organic semiconductors. The semiconductor layer 104 can be P-type or N-type, such as gallium arsenide, silicon carbide, polysilicon, monocrystalline silicon, naphthalene or molybdenum sulfide. In one embodiment, the material of the semiconductor layer 104 is transition metal sulfide. In one embodiment, the material of the semiconductor layer 104 is Molybdenum sulfide ($MoS_2$), and the thickness of the semiconductor layer 104 is about 2 nanometers.

A material of the conductive film 106 can be metal, conductive polymer or ITO. The conductive film 106 is directly deposited on the second surface 1044 of the semiconductor layer 104. A method of depositing the conductive film 106 on the first surface 1042 of the semiconductor layer 104 is not limited, and can be ion sputtering, magnetron sputtering or other coating methods. A thickness of the conductive film 106 is not limited, and can be in a range from 5 nanometers to 100 micrometers. In some embodiments, the thickness of the conductive film 106 is in a range from 5 nanometers to 100 nanometers. In other embodiments, the thickness of the conductive film 106 is in a range from 5 nanometers to 20 nanometers. A shape of the conductive film 106 is not limited, and can be bar, linear, square, or the like. In one embodiment, the conductive film 106 is strip-shaped.

The carbon nanotube 102 and the conductive film 106 are crossed with each other and separated from each other by the semiconductor layer 104. A three-layered stereoscopic structure 110 can be formed by the carbon nanotube 102, the semiconductor layer 104 and the conductive film 106. A cross-sectional area of the three-layered stereoscopic structure 110 is determined by the carbon nanotube 102. Because the carbon nanotube 102 is in nanoscale, an the cross-sectional area of the three-layered stereoscopic structure 110 is nanoscale. The three-layered stereoscopic structure 110 defines a first cross-sectional surface and a second cross-sectional surface. The first cross-sectional surface is parallel with the first surface 1042 of the semiconductor layer 104. The second cross-sectional surface is perpendicular with the first surface 1042 of the semiconductor layer 104. That is, the first cross-sectional surface is perpendicular with the second cross-sectional surface. An area of the first cross-sectional surface is determined by the diameter of the carbon nanotube 102 and a thickness of the three-layered stereoscopic structure 110. An area of the second cross-sectional surface is determined by the length of the carbon nanotube 102 and the thickness of the three-layered stereoscopic structure 110. In one embodiment, the cross-sectional area of the three-layered stereoscopic structure 110 ranges from about 0.25 $nm^2$ to about 1000 $nm^2$. In another embodiment, the cross-sectional area of the three-layered stereoscopic structure 110 ranges from about 1 $nm^2$ to about 100 $nm^2$.

A Wan der Waals heterostructure is formed by the three-layered stereoscopic structure 110 between the carbon nanotube 102, the semiconductor layer 104 and the conductive film 106. In use of the semiconductor structure 100, a Schottky junction is formed between the carbon nanotube 102, the semiconductor layer 104 and the conductive film 106 in the three-layered stereoscopic structure 110. A current can get through the three-layered stereoscopic structure 110. The carbon nanotube 102 and the conductive film 106 can be regarded as two electrodes located on surfaces of the semiconductor layer 104. When a voltage is applied on the semiconductor structure 100 from the carbon nanotube 102 and the conductive film 106, a current flows along the cross-sectional surface of the three-layered stereoscopic structure 110. A working part of the semiconductor structure 100 is three-layered stereoscopic structure 110. As such, a size of the semiconductor structure 100 is larger than or equal to the three-layered stereoscopic structure 110. As such, the semiconductor structure 100 is in nanoscale. The semiconductor structure 100 has a lower energy consumption, a higher spatial resolution, and a higher integrity.

The semiconductor structure 100 of the present invention is based on a carbon nanotube asymmetric Van der Waals heterostructure, in which the semiconductor layer 104 is a two-dimensional structure asymmetrically sandwiched between the carbon nanotubes 102 and the conductive film 106. The semiconductor layer 104 can include only one semiconductor material. The semiconductor structure 100, when used in a transistor, has a high on/off ratio (greater than $10^5$) and a large current density (greater than $10^5$ $A/cm^2$) to meet the requirements of logic circuits. In the present invention, the carbon nanotube 102 are in contact with the first surface 1042 of the semiconductor layer 104, the conductive film 106 is in contact with the second surface 1044 of the semiconductor layer 104, and the asymmetric contact of the carbon nanotube 102 and the conductive film 106 with respect to the 2D semiconductor layer makes the Van der Waals heterostructure more excellent transport performance. When the semiconductor structure 100 is used in a transistor, the van der Waals heterostructure exhibits asymmetric output characteristics at opposite source-drain biases. The diversity of transport performance is mainly because of the fact that a Fermi level of carbon nanotube is easily modulated and the semiconductor structure is asymmetrically contacted, while the carbon nanotube electrode is suitable for either electron-type or hole-type conductivity. The limitations of tunable device functionality and lateral device size make this semiconducting structure of asymmetric Van der Waals heterostructure including carbon nanotubes unique and have great potential for future nanoelectronics field and nanoelectronics field.

Figure 3:
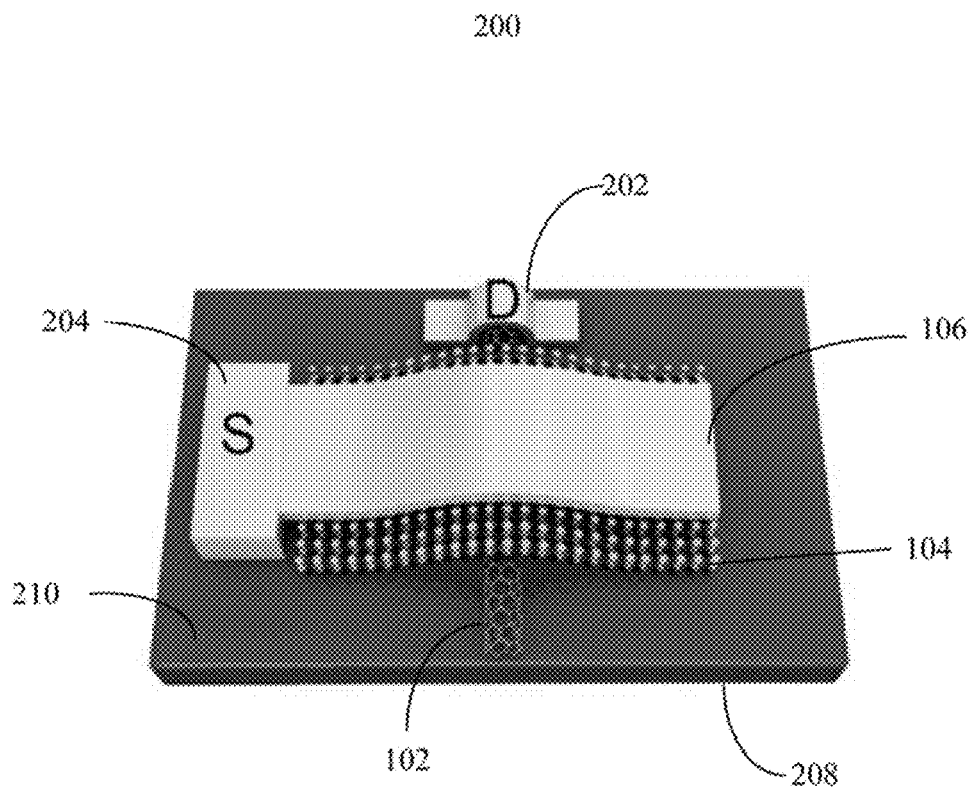
FIG. 3 is a 3D structure schematic view of a semiconductor device according to one embodiment.

Referring to FIG. 3, a semiconductor device 200 according to one embodiment is provided. The semiconductor device 200 includes a first electrode 202, a second electrode 204, a semiconductor structure, and a third electrode 208. The semiconductor structure is electrically connected to the first electrode 202 and the second electrode 204. The third electrode 208 is insulated from the semiconductor structure, the first electrode 202 and the second electrode 204 through an insulating layer 210. Characteristics of the semiconductor structure are the same as that of the semiconductor structure 100 discussed before.

In the semiconductor device 200, the third electrode 208 and the insulating layer 210 are stacked, and the semiconductor structure is located on a surface of the insulating layer 210, the insulating layer 210 is located between the third electrode 208 and the semiconductor structure. In the semiconductor structure, the carbon nanotube 102 are directly disposed on the surface of the insulating layer 210, the semiconductor layer 104 is disposed above the carbon nanotubes 102, the carbon nanotubes 102 are disposed between the semiconductor layer 104 and the insulating layer 210, and the conductive film 106 is located above the semiconductor layer 104.

The first electrode 202 and the second electrode 204 are made of conductive material, such as metal, Indium Tin Oxides (ITO), Antimony Tin Oxide (ATO), conductive silver paste, carbon nanotubes or any other suitable conductive materials. The metal can be aluminum, copper, tungsten, molybdenum, gold, titanium, palladium or any combination of alloys. In one embodiment, the first electrode 202 and the second electrode 204 are both conductive films. A thickness of the conductive film ranges from about 2 microns to about 100 microns. In one embodiment, the first electrode 302 and the second electrode 304 are metal, which has a thickness of 50 nanometers. In one embodiment, the first electrode 202 is located at one end of the carbon nanotube 102 and adhered on a surface of the carbon nanotube 102; the second electrode 204 is located at one end of the conductive film 106 and adhered on a surface of the conductive film 106.

The insulating layer 210 is made of an insulating material and has a thickness of 1 nanometer to 100 micrometers. The insulating layer 210 provides the insulation between the carbon nanotubes 102 and the third electrode 208. In this embodiment, the material of the insulating layer 210 is silicon oxide.

The third electrode 208 is made of a conductive material. The conductive material may be selected from the group consisting of metal, ITO, ATO, conductive silver paste, conductive polymer, and conductive carbon nanotube. The metallic material may be aluminum, copper, tungsten, molybdenum, gold, titanium, palladium or any combination of alloys. In this embodiment, the third electrode 208 is a layered structure, the insulating layer 210 is disposed on the surface of the third electrode 208. The first electrode 202, the second electrode 204, and the semiconductor structure are located on the insulating layer 210, and are supported by the third electrode 208 and the insulating layer 210. In the present invention, the carbon nanotube 102 are directly located on the surface of the insulating layer 210, the carbon nanotube 102 are close to the third electrode 208, the conductive film 106 is far away from the third electrode 208. As such, the conductive film 106 will not generate shielding effect between the semiconductor layer 104 and the third electrode 208, and the third electrode 208 can be used to control the semiconductor structure when the semiconductor device 200 is used.

Figure 4:
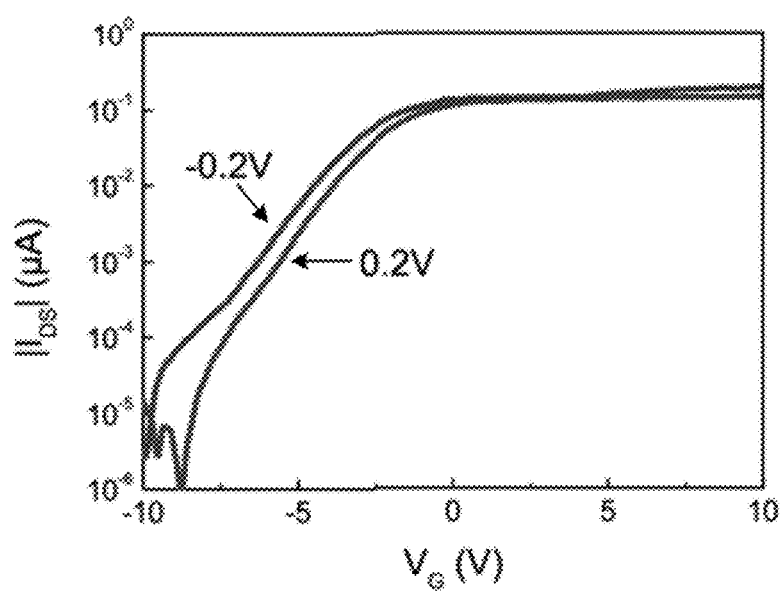
FIG. 4 is a graph showing a transfer characteristic curve of a transistor using the semiconductor device.
Figure 5:
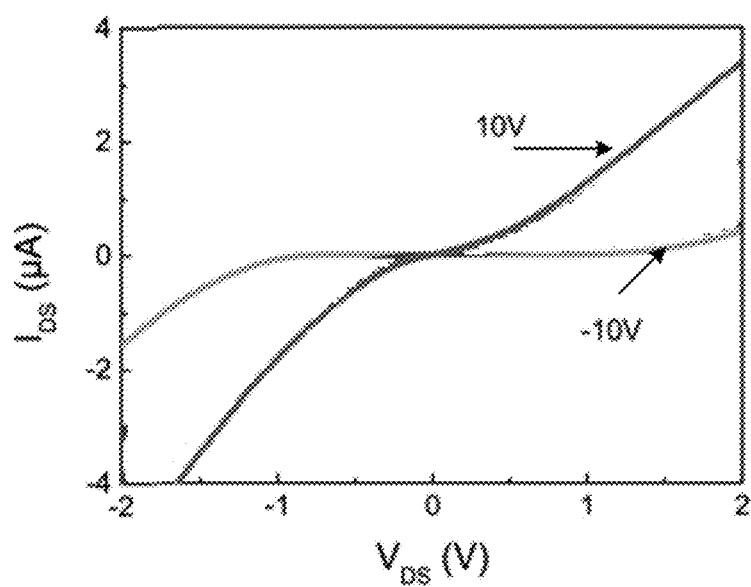
FIG. 5 is a graph showing an output characteristic curve of the transistor using the semiconductor device.

In the semiconductor device 200, a heterojunction is formed between the carbon nanotube 102 and the conductive film 106 and the semiconductor layer 104, that is, a heterojunction is formed inside the three-layered stereoscopic structure 110. The semiconductor device 200 provided in this embodiment can be a transistor, in which the first electrode 202 is a drain electrode, the second electrode 204 is a source electrode, and the third electrode 208 is a gate electrode. By applying different bias voltages on the third electrode 208, a height of the heterojunction's barrier can be changed to control the current between the first electrode 202 and the second electrode 204. In one embodiment, the material of the semiconductor layer 104 is molybdenum sulfide, which is an n-type semiconductor. The bias voltage of the first electrode 202 and the second electrode 204 is kept unchanged, when the voltage of the third electrode 208 is positive, the heterojunction's barrier in the three-layered stereoscopic structure 110 would be decreased, the current flows between the first electrode 202 and the second electrode 204, and the transistor is in on state, the current flows from the first electrode 202, the carbon nanotube 102, the three-layered stereoscopic structure 110 and the second electrode 204. The bias voltage of the first electrode 202 and the second electrode 204 is kept unchanged, when the voltage of the third electrode 208 is negative, almost no current flows between the first electrode 202 and the second electrode 204, and the transistor is in off state. Referring to FIG. 4, the transistor has a high on/off ratio, which is greater than 106; referring to FIG. 5, the transistor has and a large current density (greater than $10^5$ A/cm$^2$), to meet the requirements of logic circuits.

It is to be understood that the above-described embodiments are intended to illustrate rather than limit the present disclosure. Variations may be made to the embodiments without departing from the spirit of the present disclosure as claimed. Elements associated with any of the above embodiments are envisioned to be associated with any other embodiments. The above-described embodiments illustrate the scope of the present disclosure but do not restrict the scope of the present disclosure.

Depending on the embodiment, certain of the steps of a method described may be removed, others may be added, and the sequence of steps may be altered. The description and the claims drawn to a method may include some indication in reference to certain steps. However, the indication used is only to be viewed for identification purposes and not as a suggestion as to an order for the steps.

What is claimed is:

1. A semiconductor structure comprising:
    a semiconductor layer comprising a first surface and a second surface, a thickness of the semiconductor layer ranging from 1 nanometer to 100 nanometers;
    a carbon nanotube located on the first surface of the semiconductor layer;
    a conductive film located on the second surface of the semiconductor layer, wherein the conductive film is formed on the second surface by a depositing method, the semiconductor layer is located between the carbon nanotube and the conductive film, and the carbon nanotube, the semiconductor layer and the conductive film are stacked with each other to form a three-layered stereoscopic structure.

2. The semiconductor structure of claim 1, wherein the carbon nanotube is a metallic carbon nanotube.

3. The semiconductor structure of claim 2, wherein the carbon nanotube is a single-walled carbon nanotube, and the diameter of the carbon nanotube is in a range from about 1 nanometer to about 5 nanometers.

4. The semiconductor structure of claim 1, wherein a thickness of the semiconductor layer is in a range from about 1 nanometer to about 200 nanometers.

5. The semiconductor structure of claim 1, wherein a material of the semiconductor layer is gallium arsenide, silicon carbide, polysilicon, monocrystalline silicon, naphthalene or molybdenum sulfide.

6. The semiconductor structure of claim 1, wherein the depositing method comprises ion sputtering, magnetron sputtering and other coating methods.

7. The semiconductor structure of claim 1, wherein a thickness of the conductive film is in a range from 5 nanometers to 20 nanometers.

8. The semiconductor structure of claim 1, wherein a cross-sectional area of the three-layered stereoscopic structure is in a range from about 0.25 nm$^2$ to about 1000 nm$^2$.

9. The semiconductor structure of claim 8, wherein the cross-sectional area of the three-layered stereoscopic structure is in a range from about 1 nm$^2$ to about 100 nm$^2$.

10. The semiconductor structure of claim 9, wherein the semiconductor layer is a molybdenum sulfide single crystal.

11. A semiconductor device comprising:
    a first electrode, a second electrode, a semiconductor structure, an insulating layer and a third electrode, wherein the semiconductor structure is electrically connected to the first electrode and the second electrode, the third electrode is insulated from the semiconductor structure, the first electrode and the second electrode through the insulating layer, the semiconductor structure comprising:
        a semiconductor layer comprising a first surface and a second surface, a thickness of the semiconductor layer ranging from 1 nanometer to 100 nanometers;
        a carbon nanotube located on the first surface of the semiconductor;
        a conductive film located on the second surface of the semiconductor layer, wherein the conductive film is formed on the second surface by a depositing method, the semiconductor layer is located between the carbon nanotube and the conductive film, and the carbon nanotube, the semiconductor layer and the conductive film are stacked with each other to form a three-layered stereoscopic structure.

12. The semiconductor device of claim 11, wherein the first electrode is electrically connected with the carbon nanotube, the second electrode is electrically connected with the conductive film.

13. The semiconductor device of claim 1, wherein the carbon nanotube is directly located on a surface of the insulating layer.

* * * * *